(12) United States Patent
Kim

(10) Patent No.: US 6,806,530 B2
(45) Date of Patent: Oct. 19, 2004

(54) EEPROM DEVICE AND METHOD FOR FABRICATING SAME

(75) Inventor: Kwang-Tae Kim, Daegu Metropolitan (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/613,412

(22) Filed: Jul. 3, 2003

(65) Prior Publication Data

US 2004/0046205 A1 Mar. 11, 2004

(30) Foreign Application Priority Data

Sep. 10, 2002 (KR) .................................. 10-2002-54609

(51) Int. Cl.[7] .............................................. H01L 29/788
(52) U.S. Cl. ...................................... 257/315; 257/321
(58) Field of Search ................................. 257/315, 321

(56) References Cited

U.S. PATENT DOCUMENTS 6,316,317 B1 * 11/2001 Kawata et al. .............. 438/289
6,555,869 B2 * 4/2003 Park ........................... 257/315

* cited by examiner

Primary Examiner—David Nelms
Assistant Examiner—Tu-Tu Ho
(74) Attorney, Agent, or Firm—F. Chau & Associates LLC

(57) ABSTRACT

An EEPROM device and a method of fabricating same. In one aspect, an EEPROM device comprises: a memory transistor including a tunnel insulating layer, first conductive layer patterns, and second conductive layer patterns stacked on a first portion of a semiconductor substrate, and common source regions and floating junction regions arranged at opposite sides of the second conductive layer patterns; and a selection transistor, which is connected to the floating junction regions, and includes a gate insulating layer, the first conductive layer patterns, and the second conductive layer patterns stacked on a second portion of the semiconductor substrate, and drain regions arranged at one side of the second conductive layer patterns opposite the floating junction regions. The first conductive layer patterns in the memory transistor are separated by cell unit and floated, and the insulating layer and the second conductive layer patterns stacked on the first conductive layer patterns are connected to a cell and an adjacent cell, and the first conductive layer patterns and the second conductive layer patterns of the selection transistor are etched and connected by metal plugs. The EEPROM is fabricated using a simplified process which combines a floating gate mask and ion implantation mask into one mask, and which provides reduced resistance by connecting word lines using the metal plugs.

14 Claims, 13 Drawing Sheets

EEPROM DEVICE AND METHOD FOR FABRICATING SAME

CROSS-REFERENCE TO RELATED APPLICATION

This application claims priority to Korean Patent Application No. 2002-54609, filed on Sep. 10, 2002, which is incorporated herein in its entirety by reference.

1. Technical Field of the Invention

The present invention relates generally to methods for fabricating a non-volatile memory device. The invention further relates to an EEPROM (Electrically Erasable Programmable Read Only Memory) device and methods for fabricating an EEPROM.

2. Background

In general, semiconductor memory devices are divided into two types: (i) RAM (Random Access Memory) devices in which stored information is lost when the power supply is stopped (i.e., volatile memory); and (ii) ROM (Read Only Memory) devices in which stored information is maintained when the power supply is stopped (i.e., non-volatile memory). One example of a non-volatile memory device is an EEPROM device, which electrically erases and programs information.

FIG. 1 schematically illustrates a layout of a unit cell in a conventional EEPROM device. More specifically, as depicted in FIG. 1, a unit cell of a conventional EEPROM device comprises active regions 11 that are arranged in a horizontal direction and separated by a predetermined interval. A sense line 13 and word line 15 are disposed perpendicular to the active regions 11, and are separated from each other by a predetermined distance.

A common source region 17 is arranged in the active regions 11 at the left side of the sense line 13, and a floating junction region 19 is arranged between the sense line 13 and the word line 15 and under a tunnel region 18 on the active regions 11. In particular, an N+ ion implantation region 21 is formed under the tunnel region 18. A drain region 23 is arranged at the right side of the word line 15, and a bit line contact hole 25, which is used to connect to a bit line (not shown), is arranged in the drain region 23.

In addition, during fabrication, field ion implantation masks 27 are arranged in the horizontal direction to be parallel with the active regions 11, on inactive regions which are separated from the active regions 11 in the horizontal direction by a predetermined distance. As explained below, field ions are implanted in regions of the device in the pattern of the field ion implantation masks 27. Furthermore, during fabrication, floating gate masks 29 are installed on the sense line 13 to overlap the field ion implantation masks 27 to form floating gates. As explained below, a polysilicon layer which is patterned to form floating gates is etched at the portions corresponding to the floating gate masks 29 so that the floating gates are separated by cell unit. The floating gate masks 29 are installed only on the sense line 13 in order to prevent the word line 15 from being broken.

The conventional EEPROM device of FIG. 1 is divided into two transistor regions: a memory transistor region comprising the common source region 17, the floating junction region 19, the floating gates (not shown), and the sense line 13; and a selection transistor region comprising the floating junction region 19, the drain region 23, and the word line 15.

FIGS. 2A through 5C are cross sectional views illustrating a method for fabricating the EEPROM device of FIG. 1. More specifically, FIGS. 2A, 3A, 4A, and 5A are cross sectional views illustrating the EEPROM device of FIG. 1 along the line Y1–Y1'. FIGS. 2B, 3B, 4B, and 5B are cross sectional views illustrating the EEPROM device of FIG. 1 along the line Y2–Y2'. FIGS. 2C, 3C, 4C, and 5C are cross sectional views illustrating the EEPROM device of FIG. 1 along the line X–X'.

Referring to FIGS. 2A through 2C, a gate insulating layer 105 and a tunnel insulating layer 107 are formed on a semiconductor substrate 101 having inactive regions 103 as field insulating layers. A first polysilicon layer 109, which is later doped with impurities, is formed on the gate insulating layer 105 and the tunnel insulating layer 107.

Thereafter, first photoresist patterns 111 are formed on the first polysilicon layer 109. The first photoresist patterns 111 are formed by depositing a first photoresist layer on the first polysilicon layer 109 and then exposing and developing the first photoresist layer using a field ion implantation mask 27 (refer to FIG. 1). The first photoresist patterns 111 are formed by removing the portions of the photoresist that were covered by the field ion implantation masks 27 (i.e., positive resist).

Next, field ions 113 are implanted into regions of the semiconductor substrate 101 exposed by the first photoresist patterns 111. The field ion implantation process 113 is performed by implanting impurities, for example, boron ions into the portions of the substrate that were masked by the field ion implantation masks 27.

Referring to FIGS. 3A through 3C, the first photoresist patterns 111 are removed. Thereafter, second photoresist patterns 115 are formed on the first polysilicon layer 109. The second photoresist patterns 115 are formed by depositing a second photoresist layer on the first polysilicon layer 109, and then exposing and developing the second photoresist layer using the floating gate masks 29 (refer to FIG. 1).

Next, the first polysilicon layer 109 is etched using the second photoresist patterns 115 as an etch mask to form first polysilicon layer patterns 109a. In effect, the first polysilicon layer 109 is etched in regions corresponding to the pattern of the floating gate masks 29. As shown in FIG. 1, the floating gate masks 29 are disposed over the memory transistor region to prevent the word line 15, which is formed of the first polysilicon layer patterns or the second polysilicon patterns to be formed in a subsequent process, from being broken. As a result, the first polysilicon layer patterns 109a are separated by cell unit to become floating gates in the memory transistor region.

Referring to FIGS. 4A through 4C, after removing the second photoresist patterns 115 that were used as the etch mask to etch the first polysilicon layer, an insulating layer 117 is deposited over the semiconductor substrate 101 having the first polysilicon layer patterns 109a. Typically, the insulating layer 117 is formed of an oxide/nitride/oxide (ONO) layer.

Referring to FIGS. 5A through 5C, a second polysilicon layer 119 (in which impurities are doped) is formed on the semiconductor substrate 101 having the insulating layer. Thereafter, the second polysilicon layer 119 is etched to form second polysilicon layer patterns 119a as shown in FIG. 5C. The second polysilicon layer patterns 119a serve as the gate of the memory transistor region or the selection transistor region.

As described above, in a conventional EEPROM device, the floating gate masks are formed in the memory transistor region as shown in FIG. 1 in order to prevent the word line from being broken. In addition, only the first polysilicon layer 109 in the memory transistor region is etched (in accordance with the floating gate mask pattern), as shown in FIGS. 3A through 3C.

The process for fabrication a conventional EEPROM device as described above uses field ion implantation masks and floating gate masks to form photoresist patterns. However, as shown in FIG. 1, for example, these masks are overlapped. Accordingly, it would be desirable to develop a method for fabricating an EEPROM device in which the field ion implantation mask and the floating gate mask are combined into one mask in order to simplify the fabrication process.

SUMMARY OF THE INVENTION

The present invention is directed to EEPROM devices and methods for fabrication EEPROM devices using simplified fabrication processes.

According to one embodiment of the invention, an EEPROM device comprises: a memory transistor including a tunnel insulating layer, first conductive layer patterns, and second conductive layer patterns stacked on a first portion of a semiconductor substrate, and common source regions and floating junction regions arranged at opposite sides of the second conductive layer patterns; and a selection transistor, which is connected to the floating junction regions, and includes a gate insulating layer, the first conductive layer patterns, and the second conductive layer patterns stacked on a second portion of the semiconductor substrate, and drain regions arranged at one side of the second conductive layer patterns opposite the floating junction regions.

Preferably, the first conductive layer patterns in the memory transistor are separated by cell unit and floated, and the insulating layer and the second conductive layer patterns stacked on the first conductive layer patterns are connected to a cell and an adjacent cell, and the first conductive layer patterns and the second conductive layer patterns of the selection transistor are etched and connected by metal plugs.

Preferably, the first conductive layer patterns and the second conductive layer patterns are formed of polysilicon layers to which impurities are doped and the metal plugs are formed of a tungsten layer. Furthermore, the first conductive layer patterns and the second conductive layer patterns of the selection transistor are preferably etched at the portions of inactive regions and connected by the metal plugs.

According to another embodiment of the invention, a method of fabricating an EEPROM device comprises forming a tunnel insulating layer and a gate insulating layer on a semiconductor substrate on which active regions are defined, and forming a first conductive layer on the semiconductor substrate on which the tunnel insulating layer and the gate insulating layer are formed. The first conductive layer is patterned to form first conductive layer patterns, which are separated by cell unit, in a memory transistor, and first conductive layer patterns, which are broken in a word line direction, in a selection transistor. After forming an insulating layer on the first conductive layer patterns and inactive regions, a second conductive layer is formed on the insulating layer. By patterning the second conductive layer, second conductive layer patterns having contact holes are formed in the selection transistor. The second conductive layer patterns are patterned to form a sense line of the memory transistor and a word line of the selection transistor, and an interlevel insulating layer having metal contact holes is formed to expose the first conductive layer patterns. Thereafter, the first conductive layer patterns, which are broken in the word line direction, and the second conductive layer patterns are connected by forming metal plugs in the metal contact holes.

Preferably, after the first conductive layer is formed, field ions are implanted to the inactive regions. In addition, the same masks are preferably used to implant the field ions and form the first conductive layer patterns. Furthermore, it is preferable that the metal plugs are formed of tungsten and that the contact holes and the metal contact holes are formed on the inactive regions.

Advantageously, a method for fabricating an EEPROM according to the present invention provides a simplified process, and results in reduced resistance as a result of connecting word lines using metal plugs.

These and other embodiment, aspects, objects, features, and advantages of the present invention will be described or become apparent from the following detailed description of preferred embodiments, which is to be read in connection with the accompanying drawings.

DETAILED DESCRIPTION OF PREFERRED EMBODIMENTS OF THE INVENTION

Figure 1:
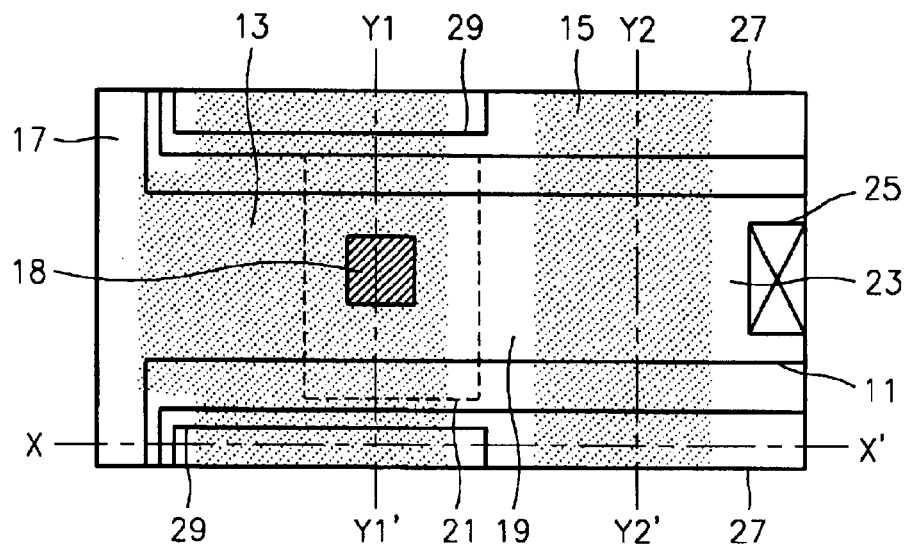
FIG. 1 schematically illustrates a layout of a unit cell of a conventional EEPROM device.
Figure 2A:
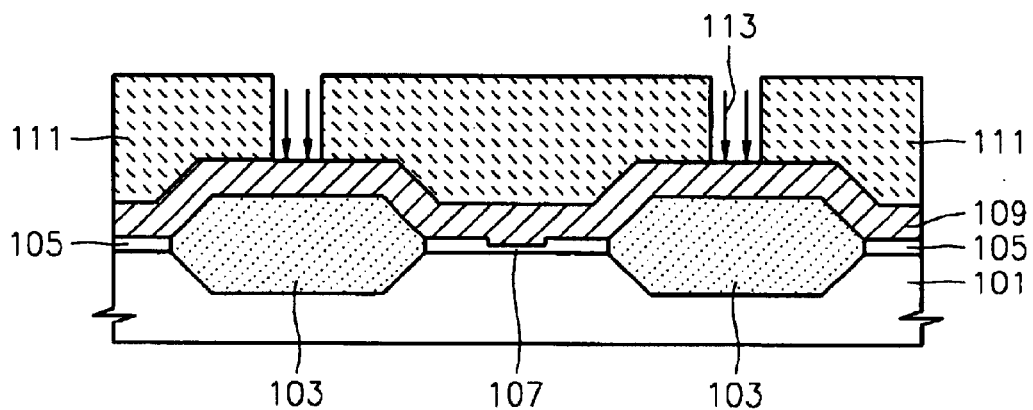
FIGS. 2A through 5C are cross sectional views illustrating a method for fabricating the EEPROM device of FIG. 1.
Figure 2B:
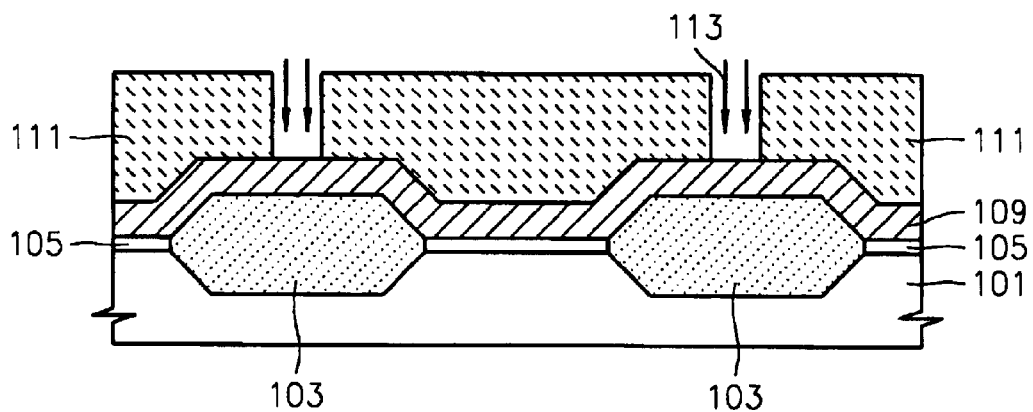
Figure 2C:
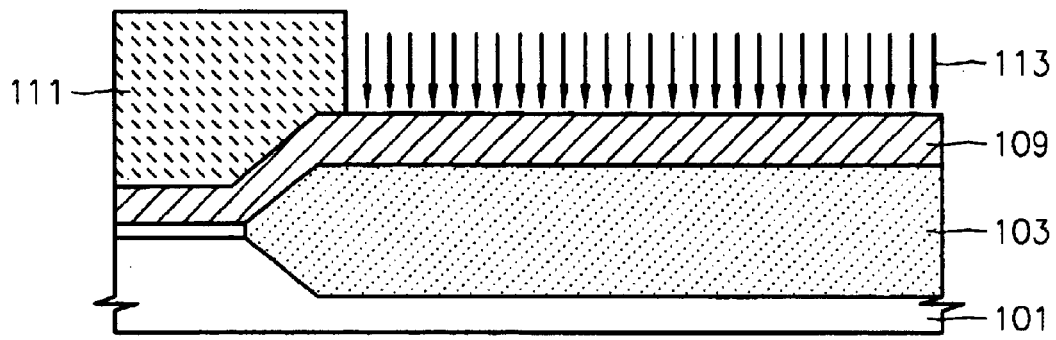
Figure 3A:
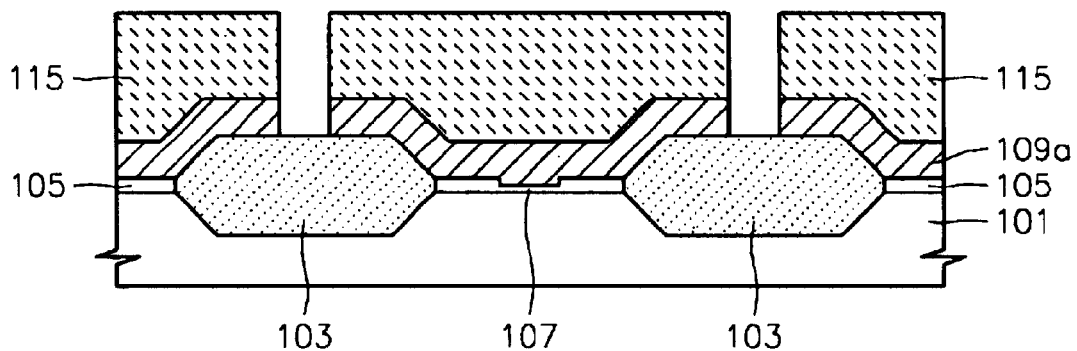
Figure 3B:
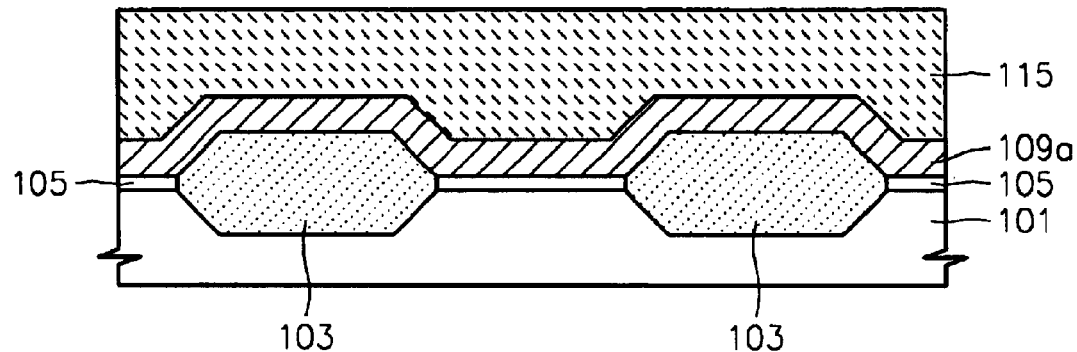
Figure 3C:
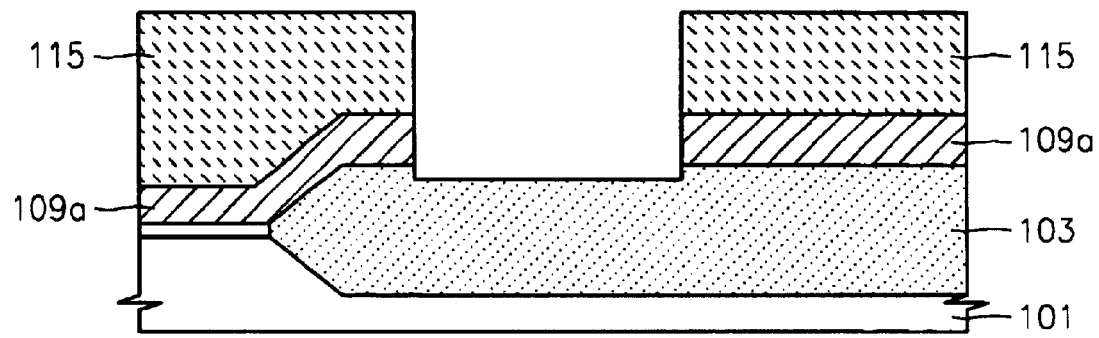
Figure 4A:
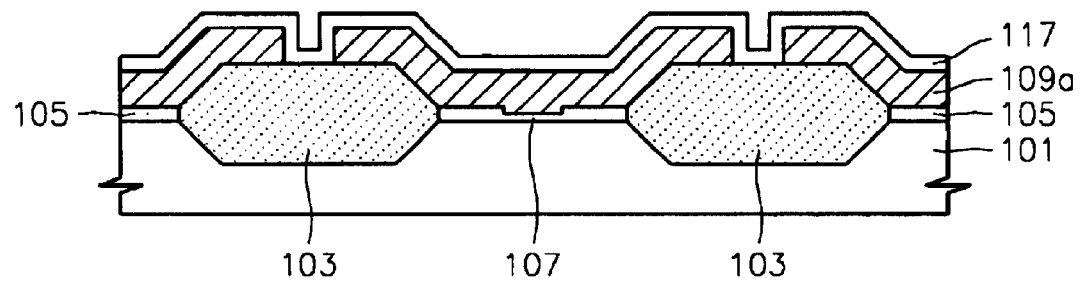
Figure 4B:
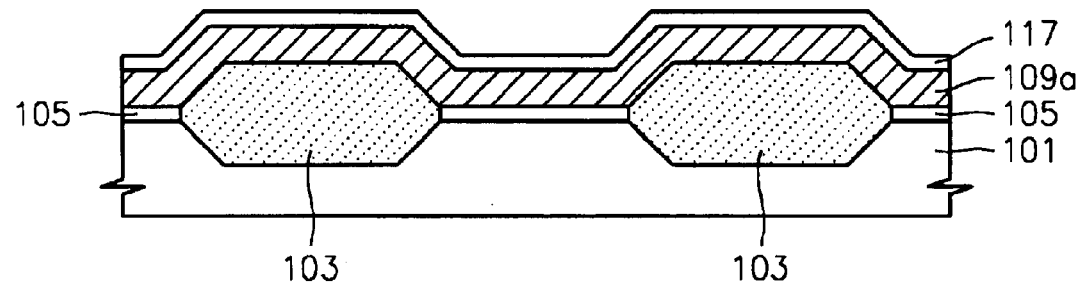
Figure 4C:
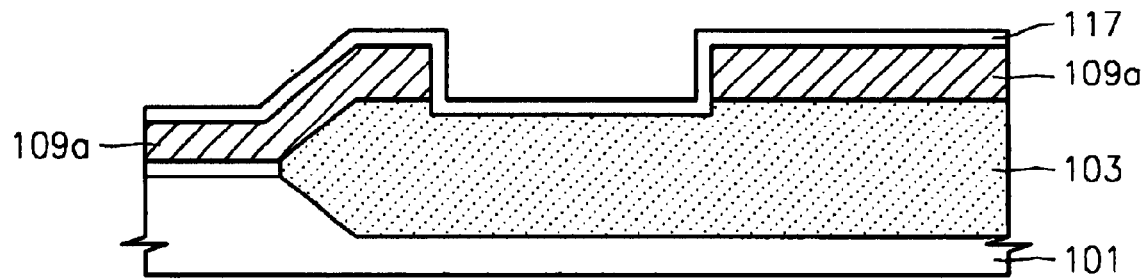
Figure 5A:
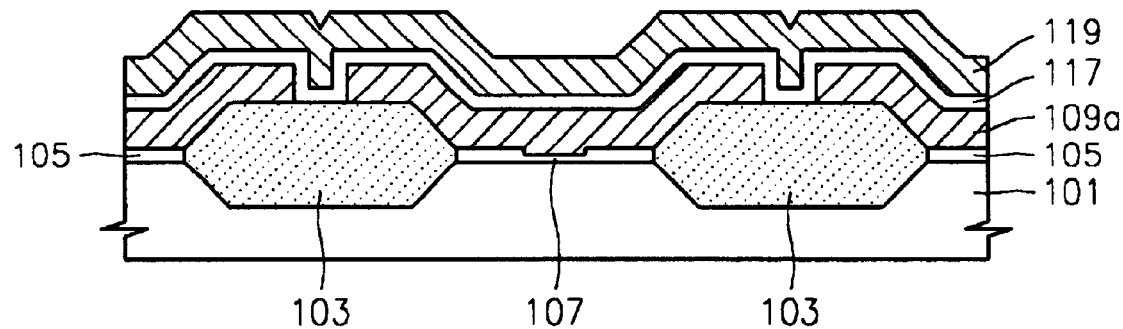
Figure 5B:
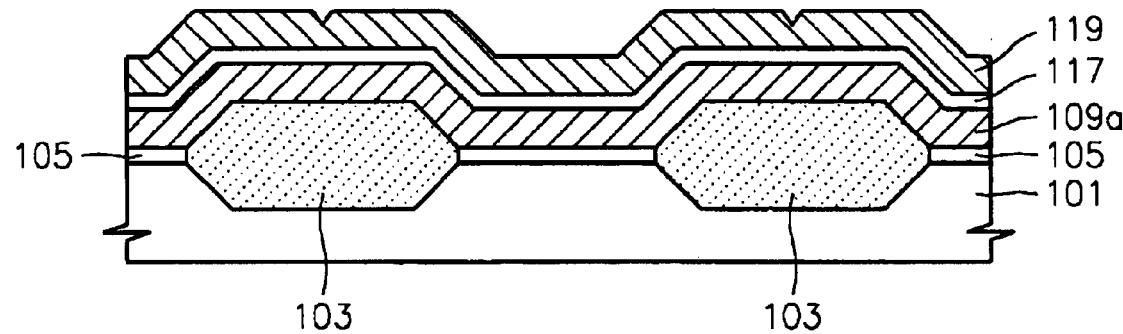
Figure 5C:
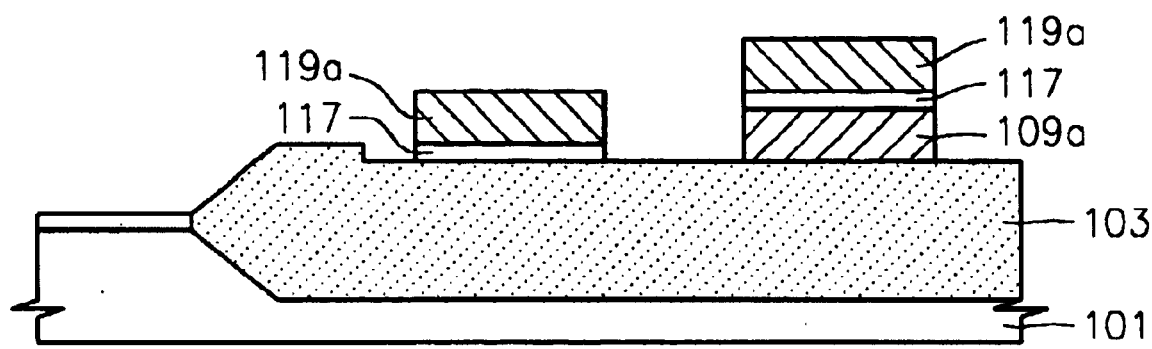

The present invention will now be described more fully with reference to the accompanying drawings, in which preferred embodiments of the invention are shown. This invention may, however, be embodied in many different forms and should not be construed as being limited to the embodiments set forth herein. The embodiments described herein are provided so that this disclosure will be thorough and complete, and will fully convey the concept of the invention to those skilled in the art. In the drawings, the size and the thickness of layers and regions are exaggerated for clarity. It should be understood that when a layer is referred to as being "on" another layer or substrate, such layer can be directly on the other layer or substrate, or intervening layers may also be present.

Figure 6:
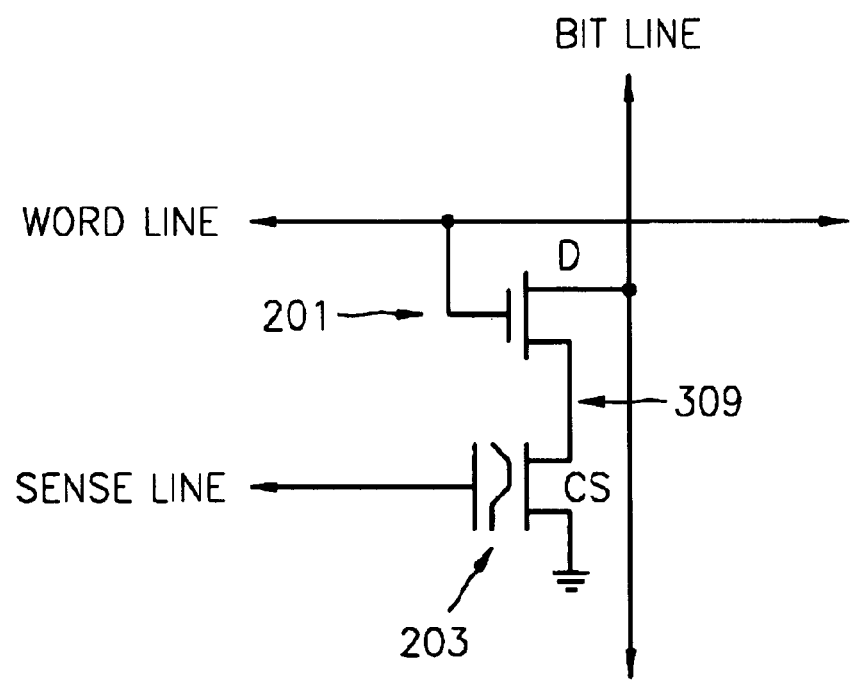
FIG. 6 is an equivalent circuit diagram illustrating an EEPROM device according to an embodiment of the present invention.

FIG. 6 is a circuit diagram of an EEPROM device according to an embodiment of the present invention. More specifically, a word line W/L is connected to the gate of a selection transistor 201, and a bit line B/L is connected to the drain D of the selection transistor. The selection transistor 201 is connected to a memory transistor 203 through a floating junction region 309. The EEPROM device forms one cell using two transistors, i.e., the selection transistor 201 and the memory transistor 203. In other words, an EEPROM device according to the present invention comprises a memory transistor 203 including a common source region CS, the floating junction region 309, a floating gate (not shown), and a sense line S/L, and a selection transistor 201 including the floating junction region 309, a drain region D, and the word line W/L.

The cell of the EEPROM device is preferably erased and programmed as follows.

To erase the cell, a voltage of about 13 V to about 20 V is applied to the sense line S/L and the word line W/L, 0 V is applied to the bit line B/L, and a floating voltage or 0V is applied to the common source CS. Thus, electrons are injected to the floating gate and the threshold voltage Vth of the memory transistor 203 is increased by about 3V to about 7 V. Thereafter, the cell of the EEPROM device is erased. To program the cell, 0 V is applied to the sense line S/L, about 13 V to 20 V is applied to the bit line B/L and the word line W/L, and the common source CS becomes a floating state. Thus, the electrons are withdrawn from the floating gate and the threshold voltage Vth of the memory transistor 203 is decreased by about 0 V to about 4 V. Thereafter, the cell of the EEPROM device is programmed.

Figure 7:
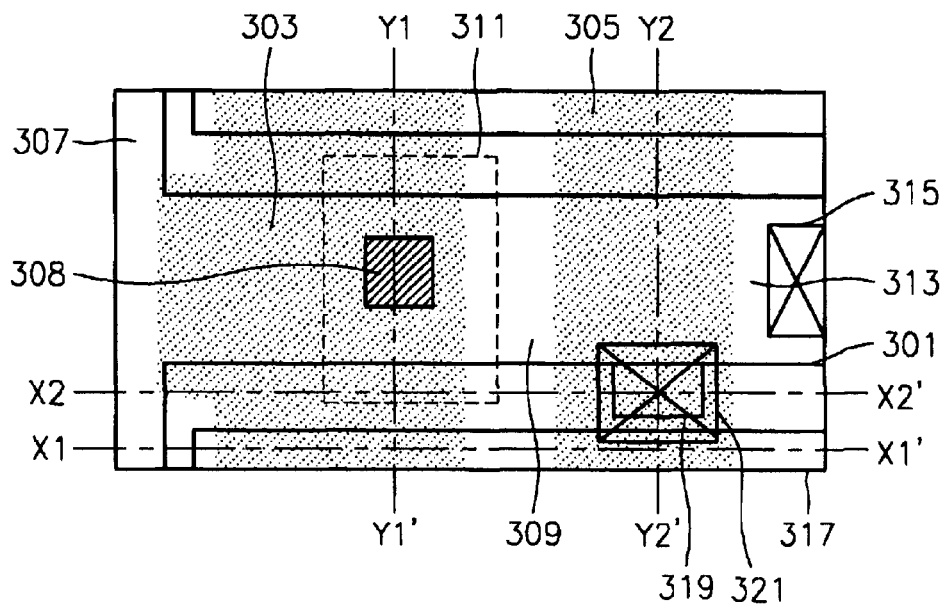
FIG. 7 schematically illustrates a layout of a unit cell of an EEPROM device according to an embodiment of the present invention.

FIG. 7 schematically illustrates a layout of a unit cell of an EEPROM device according to an embodiment of the present invention. More specifically, a unit cell of an EEPROM device according to the present invention comprises active regions 301 are arranges having a predetermined width in a horizontal direction. A sense line 303 and a word line are arranged in a vertical direction perpendicular to the active regions 301, and are separated from each other by a predetermined distance.

A common source region 307 is arranged in the active regions 301 at the left side of the sense line 303, and a floating junction region 309 is arranged between the sense line 303 and the word line 305 and under a tunnel region 308 on the active regions 301. In particular, an N+ ion implantation region 311 is formed under the tunnel region 308. A drain region 313 is arranged at the right side of the word line 305, and a bit line contact hole 315, which is connected to a bit line (not shown), is arranged in the drain region 313.

Thus, the cell of the EEPROM device has a memory transistor region 203 (refer to FIG. 6), which includes the common source region 307, a floating junction region 309, a floating gate (not shown), and the sense line 303, and a selection transistor region 201 (refer to FIG. 6), which includes the floating junction region 309, the drain region 313, and the word line 305. The floating gate is formed of first conductive layer patterns, and the sense line 303 and the word line 305 are formed of first and second conductive layer patterns, which will be described later.

First masks 317 for implanting field ions and forming the floating gate are arranged in the horizontal direction parallel with the active regions 301, on inactive regions, which are separated from the active regions 301 by a predetermined distance in the vertical direction. The field ions are implanted in the regions defined by the first masks 317, which are formed on the inactive regions.

In a cell layout of an EEPROM device according to the present invention, the conventional floating gate masks 29 (refer to FIG. 1) are not separately installed. In contrast, the first masks 317 serve as both the field ion implantation masks and the floating gate masks. In other words, the field ion implantation mask and the floating gate mask are combined into one mask. Portions of the first conductive layer serving as the floating gate or the word line are etched at the first mask 317 regions. Thus, the first conductive layer for floating gate is etched at the first mask 317 regions of the memory transistor to separate the floating gates by cell unit, and the first conductive layer patterns used as the word line are separated in the first mask 317 regions of the selection transistor region.

In addition, to electrically connect the first conductive layer patterns that are separated by the first masks 317, a second mask 319 and a second metal hole 321 are formed on the inactive regions of the selection transistor region.

Portions of a second conductive layer, which serves as the sense line and the word line, are etched at the second mask 319 portions, and a metal plug is filled in the metal contact hole 321. Thus, the first conductive layer patterns, which are separated by the first masks 317, are electrically connected by the metal plug and the second conductive layer patterns. As a result, the first conductive layer patterns and the second conductive layer patterns serving as the word line are connected by the metal plug. It is not necessary to prepare the masks for forming the second masks 319 and the metal contact hole 321 separately.

Figure 11A:
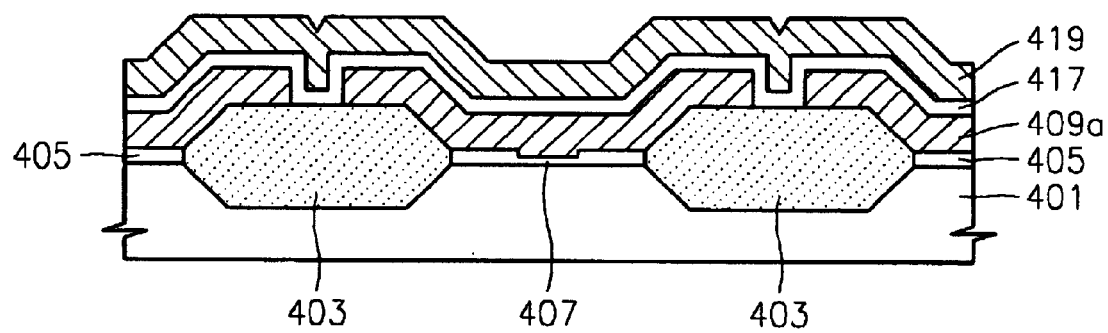
Figure 11B:
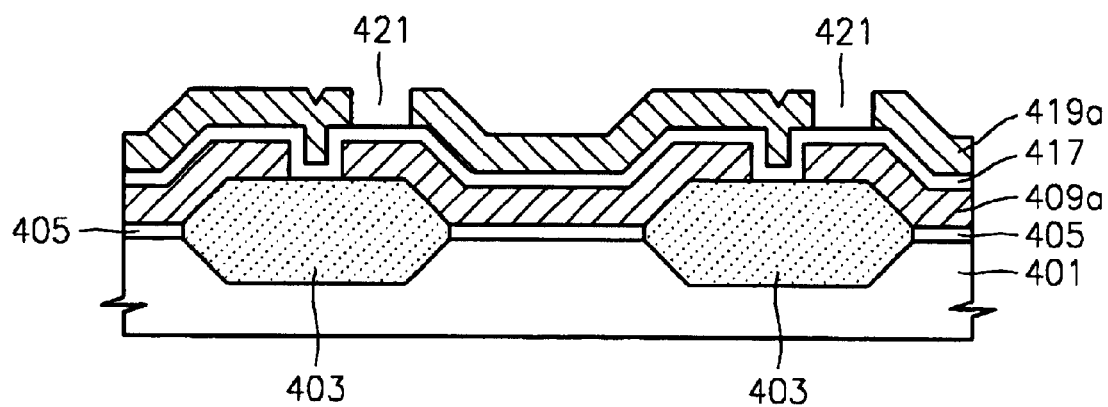
Figure 11C:
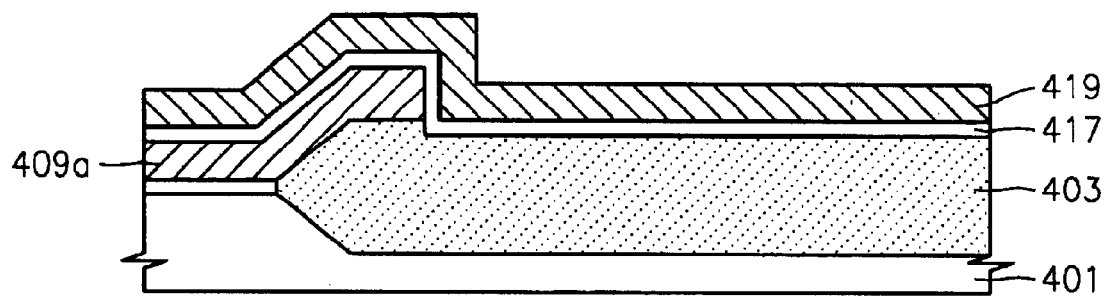
Figure 11D:
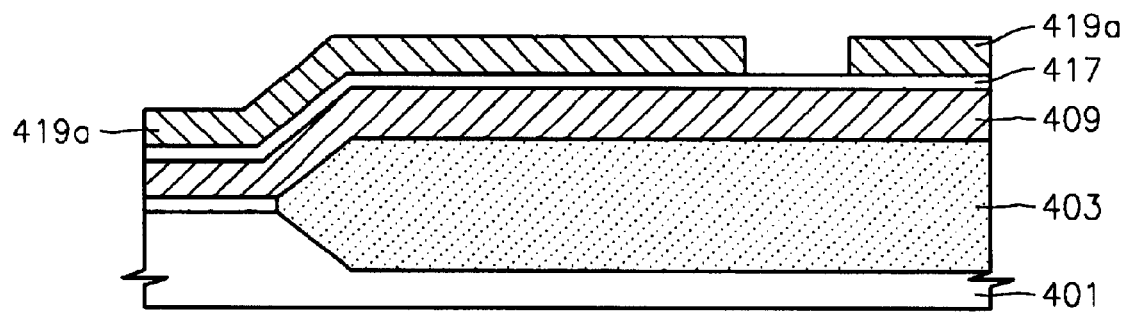
Figure 12A:
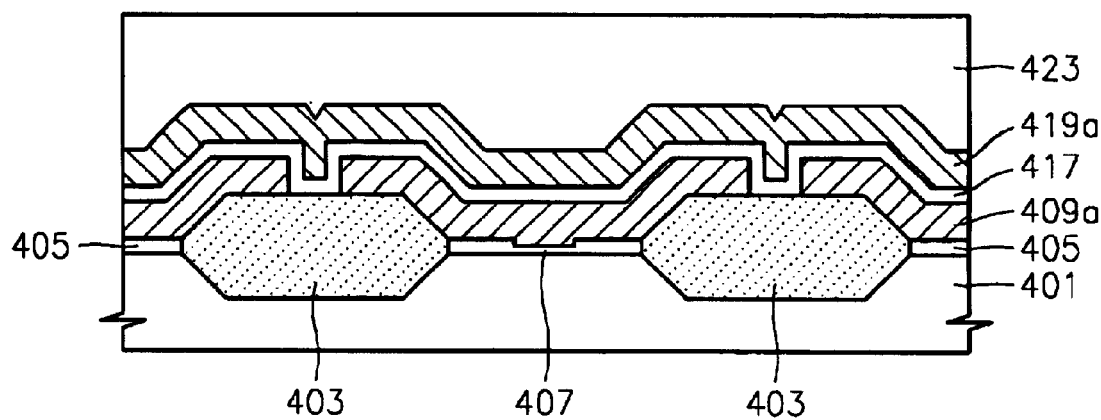
Figure 12B:
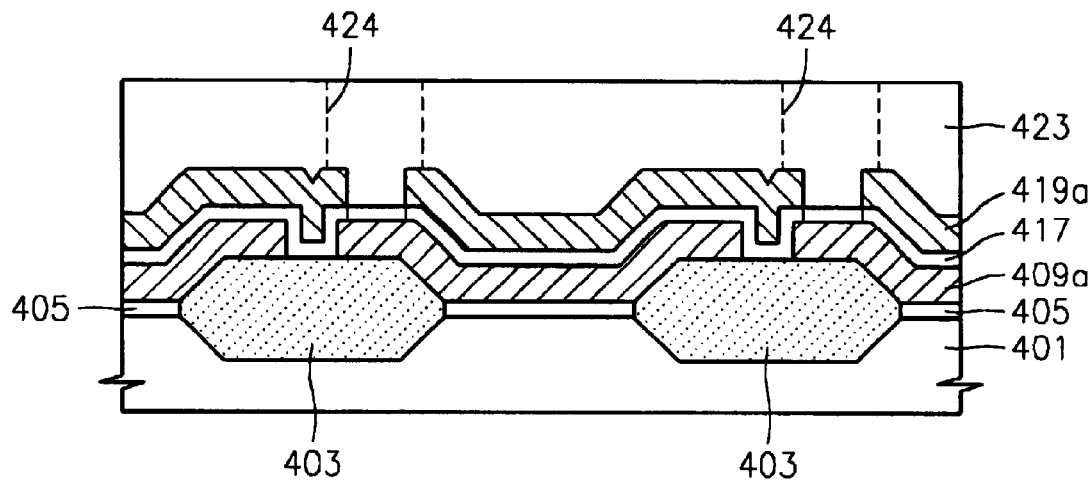
Figure 12C:
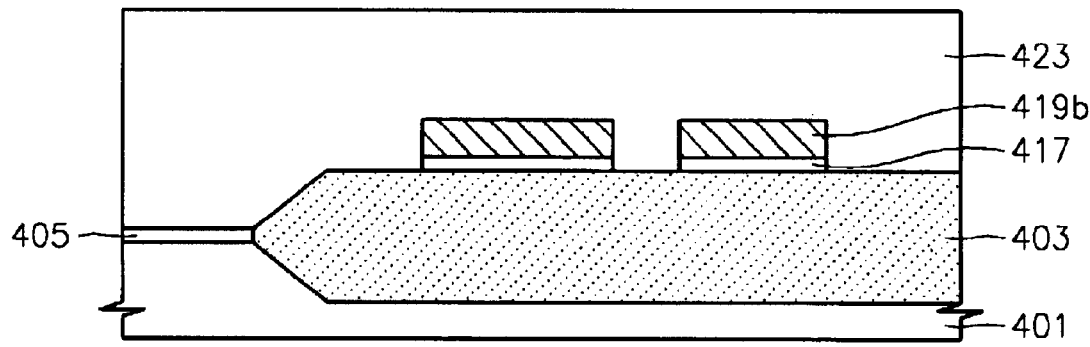
Figure 12D:
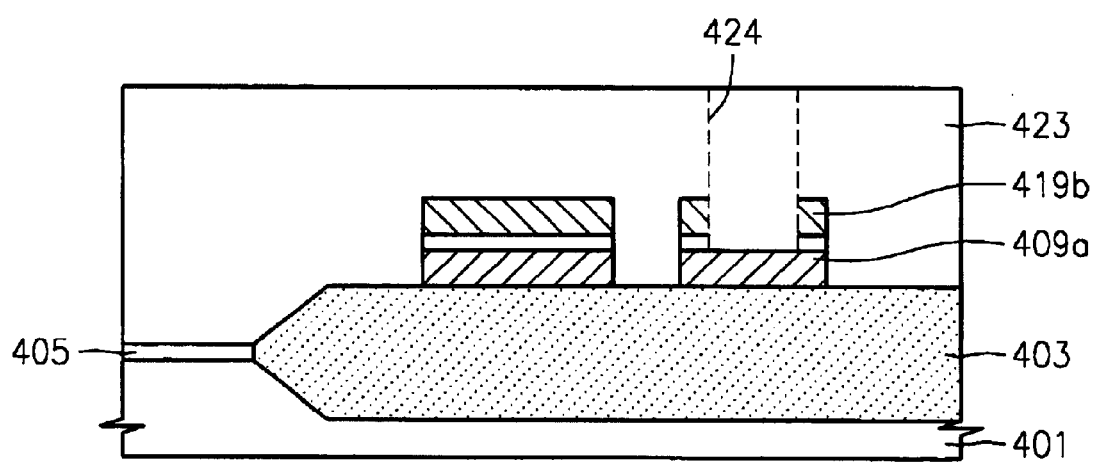
Figure 13A:
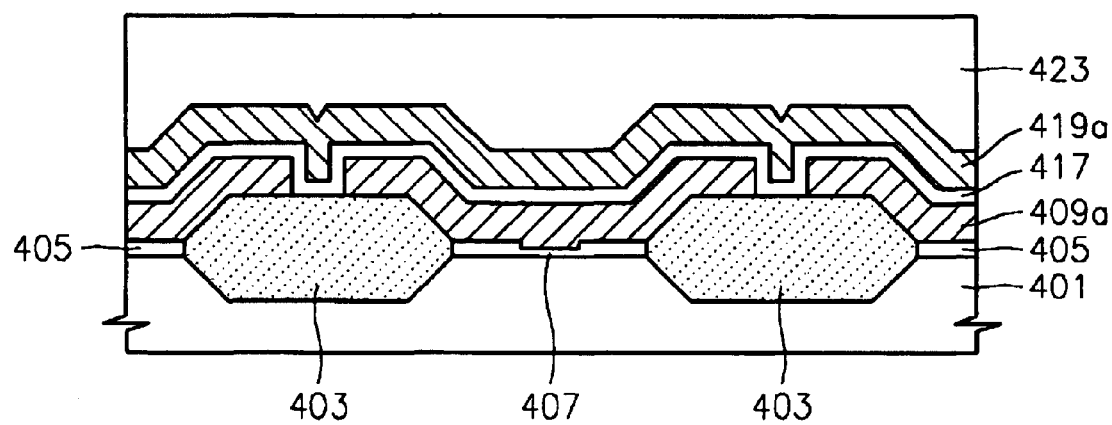
Figure 13B:
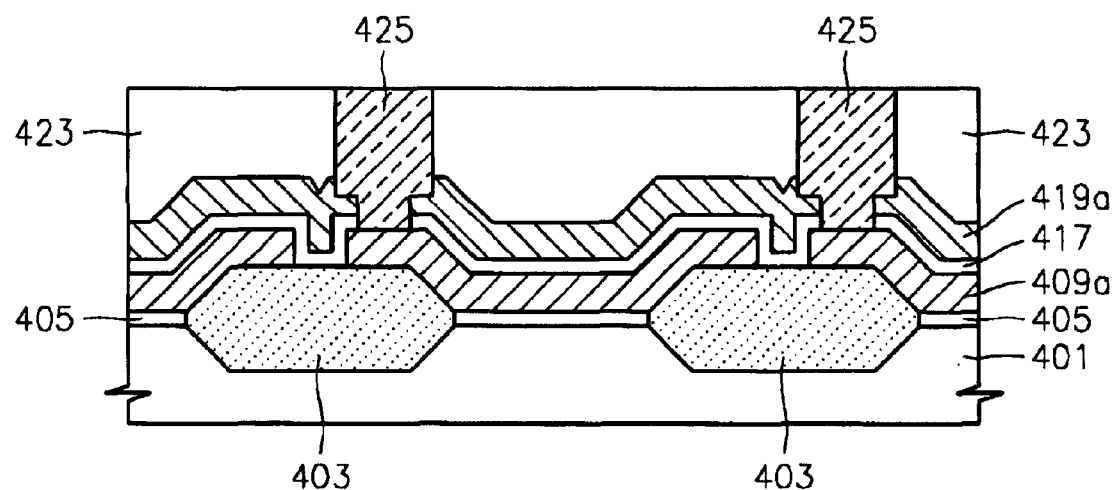
Figure 13C:
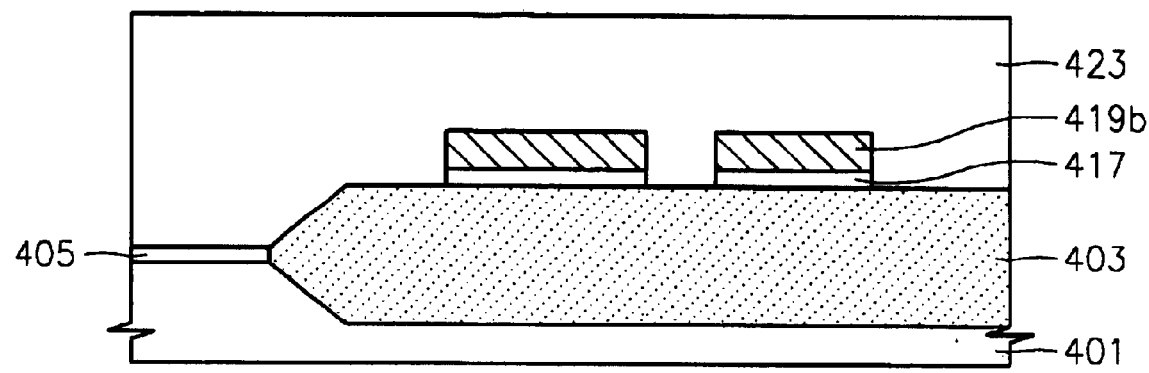
Figure 13D:
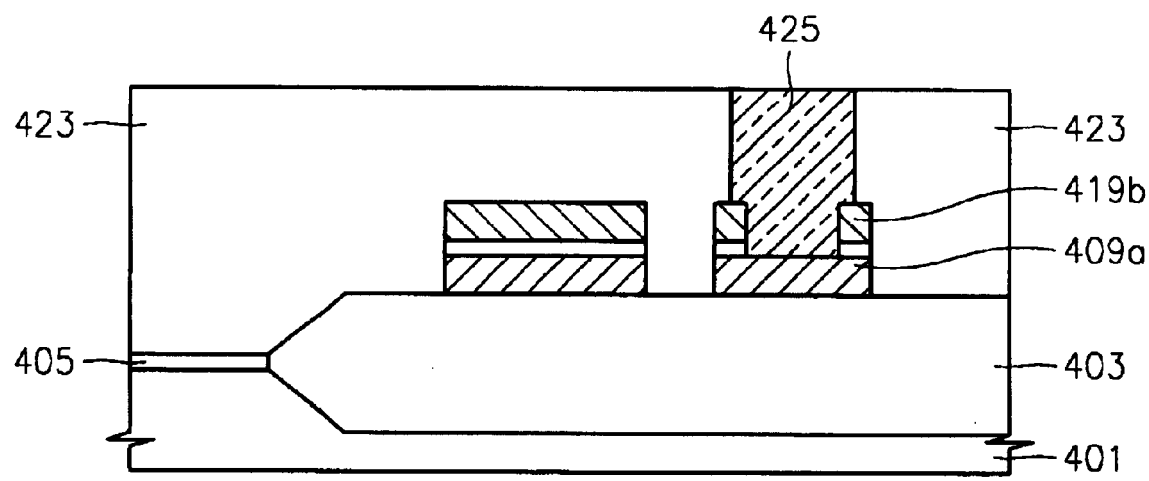

FIGS. 8A through 13D are cross sectional views illustrating a method for fabricating an EEPROM device according to an embodiment of the invention, such as the device illustrated in FIG. 7. More specifically, FIGS. 8A, 9A, 10A, 11A, 12A, and 13A are cross sectional views illustrating the EEPROM device of FIG. 7 along the line Y1–Y1'. FIGS. 8B, 9B, 10B, 11B, 12B, and 13B are cross sectional views illustrating the EEPROM device of FIG. 7 along the line Y2–Y2'. FIGS. 8C, 9C, 10C, 11C, 12C, and 13C are cross sectional views illustrating the EEPROM device of FIG. 7 along the line X1–X1'. FIGS. 11D, 12D, and 13D are cross sectional views illustrating the EEPROM device of FIG. 7 along the line X2–X2'.

Figure 8A:
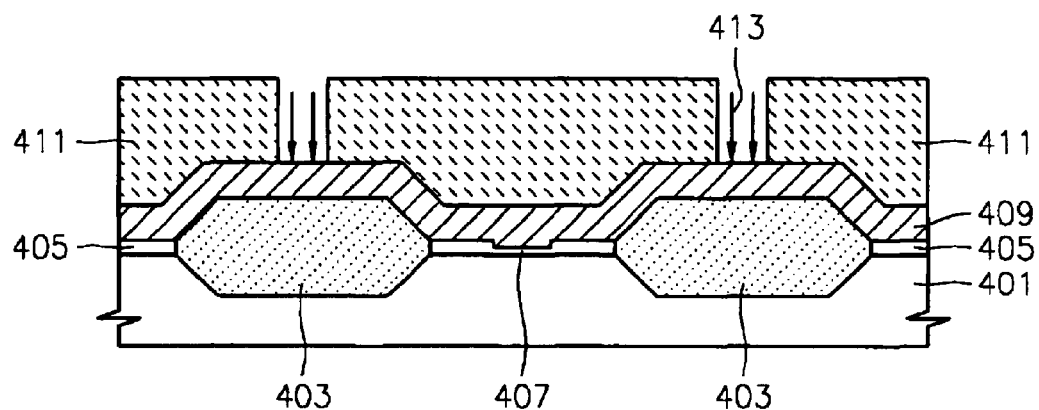
FIGS. 8A through 13D are cross sectional views illustrating a method for fabricating an EEPROM device according to an embodiment of the invention.
Figure 8B:
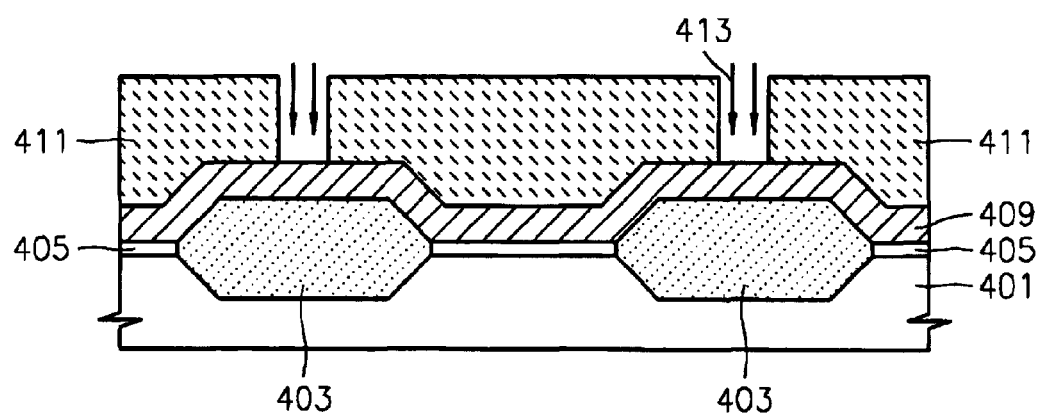
Figure 8C:
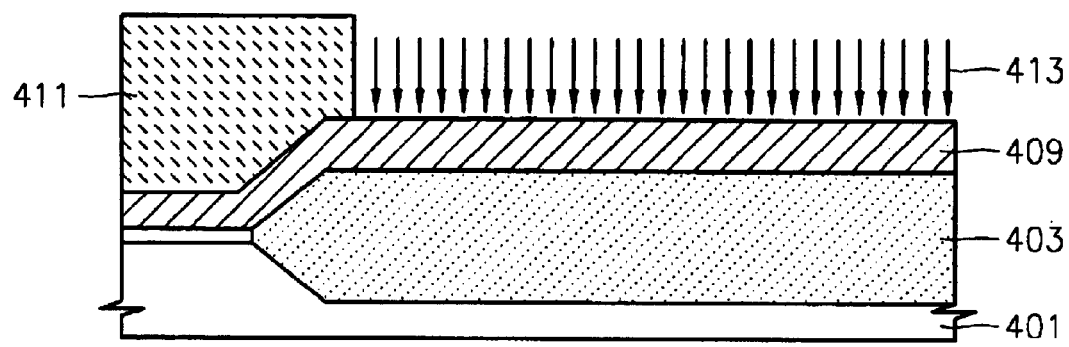

Referring to FIGS. 8A through 8C, a gate insulating layer 405 and a tunnel insulating layer 407 are formed on a semiconductor substrate 401 having an inactive region 403, and act as field insulating layers. A first conductive layer 409 is formed on the gate insulating layer 405 and the tunnel insulating layer 407. The first conductive layer 409 is formed of a polysilicon layer which is doped with impurities.

Thereafter, photoresist patterns 411 are formed on the first conductive layer 409. The photoresist patterns 411 are formed by depositing a first photoresist layer on the first conductive layer 409, and then exposing and developing the first photoresist layer using first masks 317 (refer to FIG. 7). The portions of the first photoresist layer that were masked by the first masks 317 are removed (positive resist) to form the photoresist patterns 411.

Next, field ions 413 are implanted in the semiconductor substrate 401 having the photoresist patterns 411. By performing the field ion implantation process 413, impurities, for example, boron ions are implanted into portions of the substrate corresponding to the image of the field masks 317.

Figure 9A:
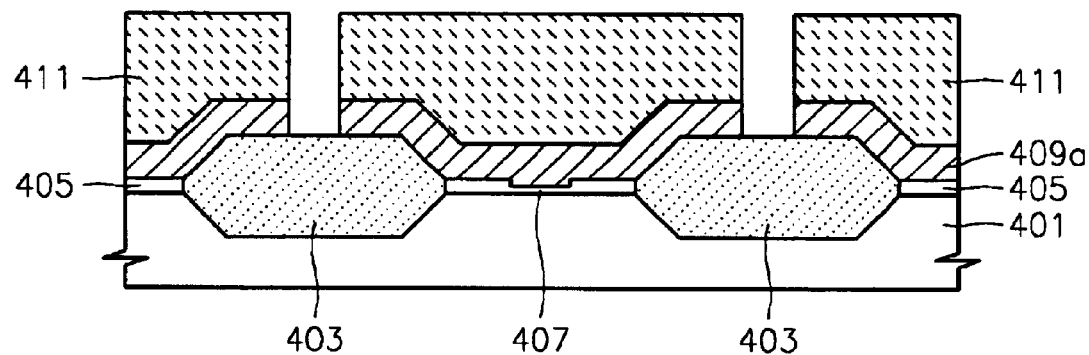
Figure 9B:
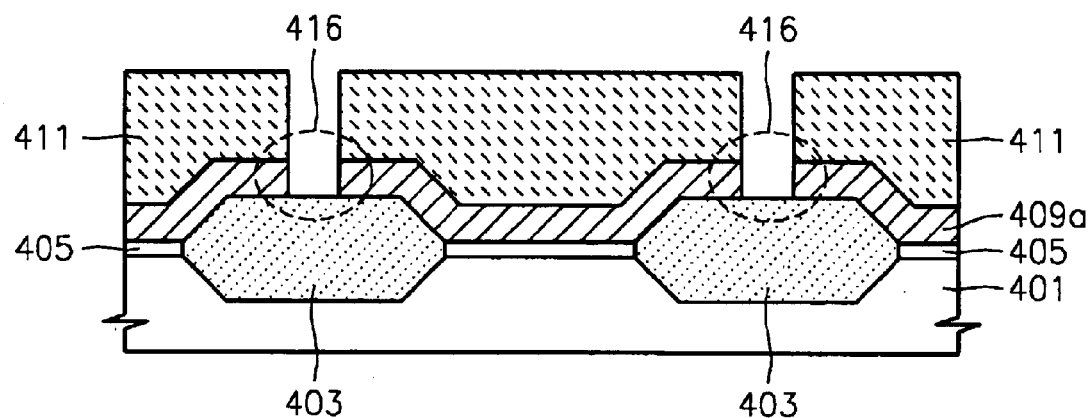
Figure 9C:
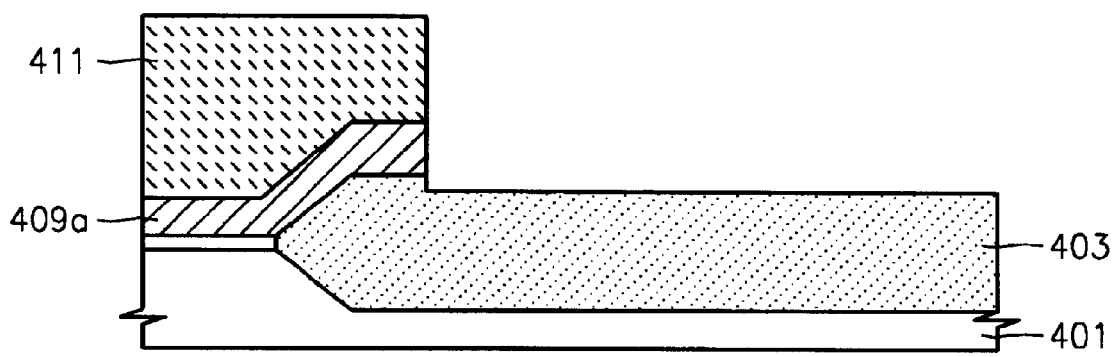

Referring to FIGS. 9A through 9C, the first conductive layer 409 is etched using the photoresist patterns 411 as an etch mask to form first conductive layer patterns 409a. The portions where the first masks 317 of FIG. 7 are arranged are the etched portions of the first conductive layer 409. Accordingly, the first conductive layer patterns 409a are separated by cell unit and floated. As a result, floating gates are formed in the memory transistor region using the first conductive layer patterns 409a.

In this case, since the field ion implantation masks and the floating gate masks in the conventional EEPROM are effectively replaced by the first masks 317 in the EEPROM device as shown in FIG. 7, the first conductive layer patterns 409a used as the word line are broken in the selection transistor region as depicted by reference numeral 416 in FIG. 9B.

Figure 10A:
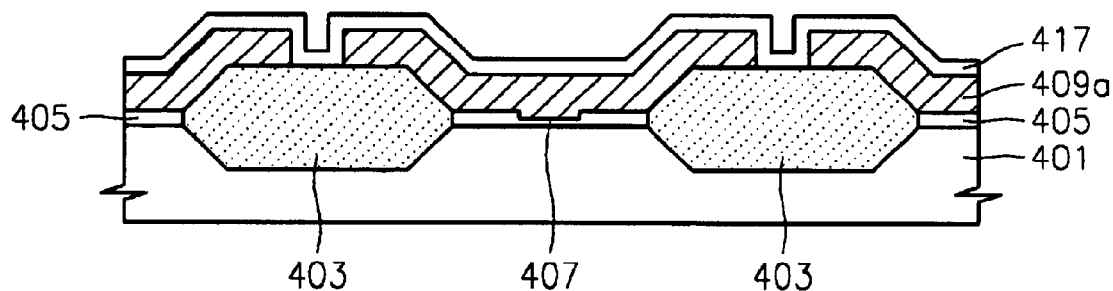
Figure 10B:
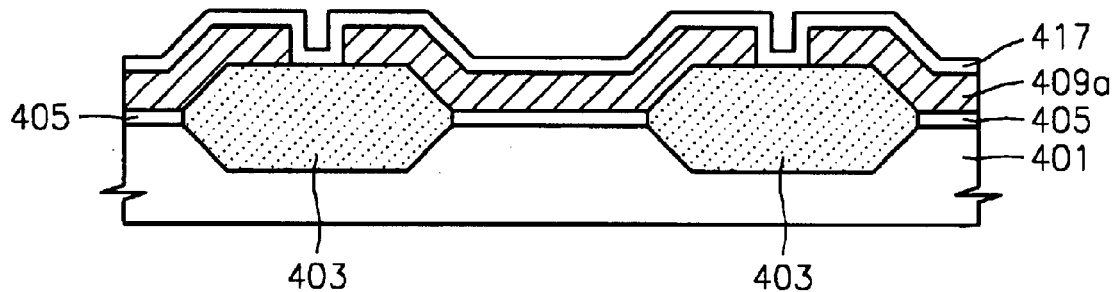
Figure 10C:
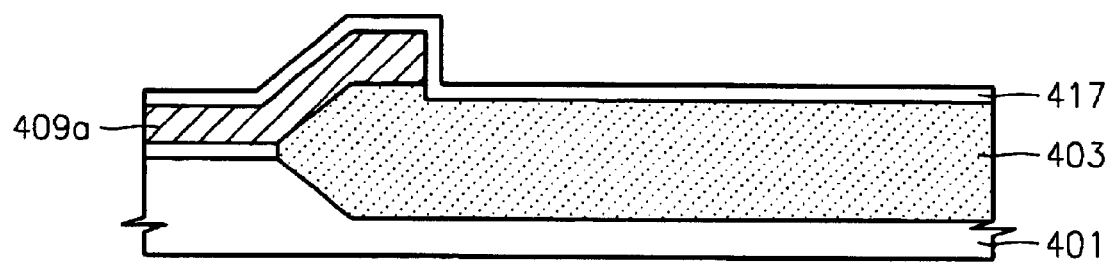

Referring to FIGS. 10A through 10C, the photoresist patterns 411 that were used as the etch mask to etch the first conductive layer 409 are removed. Thereafter, an insulating layer 417 is formed on the semiconductor substrate 401 having the first conductive layer patterns 409a and the inactive regions 403. The insulating layer 417 is preferably an oxide/nitride/oxide (ONO) layer.

Referring to FIGS. 11A through 11D, a second conductive layer 419 is formed on the semiconductor substrate 401 having the insulating layer 417. The second conductive layer 419 is formed of a polysilicon layer in which impurities are doped. Thereafter, the second conductive layer 419 is etched to form second conductive layer patterns 419a having contact holes 421 as shown in FIGS. 11B and 11D. The contact holes 421 are the portions etched by the second masks 319 of FIG. 7.

Referring to FIGS. 12A through 12D, an interlevel insulating layer 423 is formed on the semiconductor substrate 401 having the second conductive layer patterns 419a with the contact holes 421. Thereafter, the second conductive layer patterns 419a are patterned to form second conductive layer patterns 419b serving as a control gate, i.e., sense line, of the memory transistor or the word line of the selection transistor, as shown in FIGS. 12C and 12D. Next, the second interlevel insulating layer 423 is etched to form metal contact holes 424. The metal contact holes 424 are the portions denoted by reference numeral 321 in FIG. 7.

Referring to FIGS. 13A through 13D, a metal layer, for example, a tungsten layer, is formed on the semiconductor layer 401 having the metal contact holes 424, and the metal layer is planarized to form metal plugs 425. The metal plugs 425 are formed on portions corresponding to the metal contact hole 321 in FIG. 7. The metal plugs 425 connect the first conductive layer patterns 409a, which are broken by the first masks 317 as shown in FIG. 13B, and the second conductive layer patterns 419a.

As a result, the insulating layer 417 and the second conductive layer patterns 419a, which are formed on the first conductive layer patterns 409a in the memory transistor region, are connected to the cell and the adjacent cell as shown in FIG. 13A. The first conductive layer patterns 409a and the second conductive layer patterns 419a of the selection transistor region are etched in the portions of the inactive regions 403 and connected using the metal plugs 425.

As described above, a method for fabricating an EEPROM device according to the present invention can be simplified by not requiring the installation of the floating gate masks 29 of FIG. 1, but rather using the first masks 317 as the floating gate masks. In addition, the metal plugs are filled in the metal contact holes to prevent the word line formed of the first conductive layer patterns and the second conductive layer patterns from being broken. Accordingly, the present invention provides a simplified fabrication as compared to the conventional process described above, by omitting one mask process. Furthermore, a fabrication process according to the invention results in reduced resistance by connecting the word lines using the metal plugs.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A memory device, comprising:
   a memory transistor comprising a tunnel insulating layer, first conductive layer patterns, and second conductive layer patterns stacked on a first portion of a semiconductor substrate, and a common source region and a floating junction region arranged at opposite sides of the second conductive layer patterns; and
   a selection transistor, which is connected to the floating junction region, the selection transistor comprising a gate insulating layer, the first conductive layer patterns, and the second conductive layer patterns stacked on a second portion of the semiconductor substrate, and a drain region arranged at one side of the second conductive layer patterns opposite the floating junction region,
   wherein the first conductive layer patterns in the memory transistor are separated by cell unit and floated, wherein the insulating layer and the second conductive layer patterns stacked on the first conductive layer patterns are connected to a cell and an adjacent cell, and wherein the first conductive layer patterns and the second conductive layer patterns of the selection transistor are etched and connected by metal plugs.

2. The device of claim 1, wherein the first conductive layer patterns and the second conductive layer patterns comprise polysilicon layers to which impurities are doped.

3. The device of claim 1, wherein the metal plugs comprise a tungsten layer.

4. The device of claim 1, wherein the first conductive layer patterns and the second conductive layer patterns of the selection transistor are etched at portions of inactive regions and connected by the metal plugs.

5. A method of fabricating an EEPROM memory device, comprising the steps of:
   forming a tunnel insulating layer and a gate insulating layer on a semiconductor substrate on which active regions are defined;
   forming a first conductive layer on the semiconductor substrate on which the tunnel insulating layer and the gate insulating layer are formed;
   patterning the first conductive layer to form first conductive layer patterns, which are separated by cell unit, in a memory transistor, and first conductive layer patterns, which are broken in a word line direction, in a selection transistor;
   forming an insulating layer on the first conductive layer patterns and inactive regions;
   forming a second conductive layer on the insulating layer;
   patterning the second conductive layer to form second conductive layer patterns having contact holes in the selection transistor;
   patterning the second conductive layer patterns to form a sense line of the memory transistor and a word line of the selection transistor;
   forming an interlevel insulating layer having metal contact holes exposing the first conductive layer patterns on the semiconductor substrate; and
   forming metal plugs in the metal contact holes to connect the first conductive layer patterns, which are broken in the word line direction, and the second conductive layer patterns by the metal plugs.

6. The method of claim 5, further comprising implanting field ions into the inactive regions after the first conductive layer is formed.

7. The method of claim 6, wherein the same masks are used to implant the field ions and form the first conductive layer patterns.

8. The method of claim 5, wherein the metal plugs comprise tungsten.

9. The method of claim 5, wherein the contact holes and the metal contact holes are formed on the inactive regions.

10. A method of fabricating an EEPROM memory device comprising a plurality of memory cells, comprising the steps of:

depositing a first conductive layer on a semiconductor substrate having active and inactive regions, and patterning the first conductive layer to form floating gates and first wordline portions;

depositing an insulating layer;

depositing a second conductive layer and etching the second conductive layer to form first contacts holes in the second conductive layer, and patterning the second conductive layer to form sense line contacts and second wordline portions;

depositing an interlevel insulating layer and forming second contact holes in the interlevel insulating layer corresponding to the first contact holes in the second conductive layer; and filling the first and second contact holes with a conductive material to connect the first wordline portions of the first conductive layer and the second wordline portions of the second conductive layer to connect adjacent memory cells to a wordline.

11. The method of claim 10, further comprising implanting field ions into the inactive regions after the first conductive layer is formed.

12. The method of claim 11, wherein the same masks are used to implant the field ions and pattern the first conductive layer.

13. The method of claim 10, wherein the conductive material comprises tungsten.

14. The method of claim 10, wherein the first and second contact holes are formed over the inactive regions.

* * * * *